United States Patent
Hokazono et al.

(10) Patent No.: US 10,707,870 B2
(45) Date of Patent: Jul. 7, 2020

(54) HIGH-SIDE DRIVER CIRCUIT

(71) Applicant: Mitsubishi Electric Corporation, Tokyo (JP)

(72) Inventors: Kazuya Hokazono, Tokyo (JP); Dong Wang, Tokyo (JP); Jun Fukudome, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/584,409

(22) Filed: Sep. 26, 2019

(65) Prior Publication Data

US 2020/0169257 A1    May 28, 2020

(30) Foreign Application Priority Data

Nov. 22, 2018  (JP) .................... 2018-218752

(51) Int. Cl.
*H03K 19/0185* (2006.01)
*H03K 19/0175* (2006.01)
*H03K 17/687* (2006.01)
*H03K 19/0944* (2006.01)

(52) U.S. Cl.
CPC ... *H03K 19/018507* (2013.01); *H03K 17/687* (2013.01); *H03K 19/017536* (2013.01); *H03K 19/0944* (2013.01); *H03K 2217/0063* (2013.01); *H03K 2217/0081* (2013.01)

(58) Field of Classification Search
CPC ......... H03K 17/687; H03K 19/017536; H03K 19/018507; H03K 19/0944; H03K 2217/0063; H03K 2217/0081
See application file for complete search history.

(56) References Cited

U.S. PATENT DOCUMENTS

| | | | | | |
|---|---|---|---|---|---|
| 4,283,674 | A | * | 8/1981 | Kominami | G05F 3/18 323/313 |
| 5,929,715 | A | * | 7/1999 | Nakamiya | G04F 5/06 331/158 |
| 10,116,302 | B1 | * | 10/2018 | Murakami | H03K 17/687 |
| 2004/0160437 | A1 | * | 8/2004 | Onozawa | G09G 3/2085 345/211 |

(Continued)

FOREIGN PATENT DOCUMENTS

WO    2015/001926 A1    1/2015

*Primary Examiner* — Alexander H Taningco
*Assistant Examiner* — Kurtis R Bahr
(74) *Attorney, Agent, or Firm* — Studebaker & Brackett PC

(57) ABSTRACT

An object of the present invention is to reduce a chip area of the high-side driver circuit. A high-side driver circuit of the present invention is a high-side driver circuit in which a first potential is set as a power supply potential, which includes a constant voltage circuit configured to operate with a second potential as a reference potential, and generate, from the first potential, a third potential which is lower than the first potential and higher than the second potential, a logic circuit configured to operate with the third potential as a reference potential, a level shift circuit configured to shift the reference potential of the output signal of the logic circuit from the third potential to the second potential, and a driver circuit in which the second potential is set as a reference potential, and configured to drive a switching element by the output signal.

6 Claims, 5 Drawing Sheets

(56) References Cited

U.S. PATENT DOCUMENTS

| | | | |
|---|---|---|---|
| 2012/0249227 A1* | 10/2012 | Nakayama | G05F 3/20 |
| | | | 327/543 |
| 2014/0268441 A1* | 9/2014 | Mallikarjunaswamy | ................... |
| | | | H03K 17/08104 |
| | | | 361/56 |
| 2015/0263620 A1* | 9/2015 | Huang | H03K 5/1515 |
| | | | 323/271 |
| 2015/0380400 A1 | 12/2015 | Jonishi | |
| 2017/0222649 A1* | 8/2017 | Koo | H03K 19/018592 |

* cited by examiner

F I G. 5
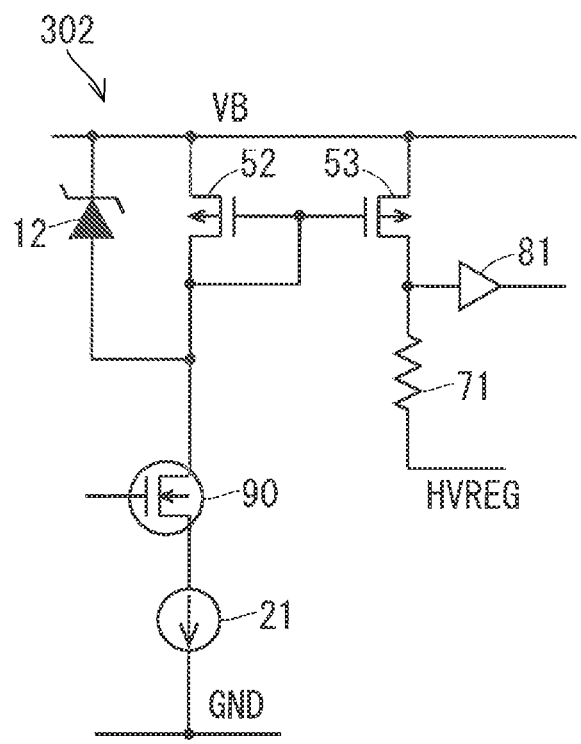

HIGH-SIDE DRIVER CIRCUIT

BACKGROUND OF THE INVENTION

Field of the Invention

The invention relates to a high-side driver circuit.

Description of the Background Art

A general integrated circuit is configured with a low breakdown voltage MOSFET (metal-oxide-semiconductor field-effect transistor) having a breakdown voltage of about 8 V and a medium breakdown voltage MOSFET having a breakdown voltage of about 24 V. The area of a single-unit device increases as the breakdown voltage increases. Therefore, it is advantageous from the viewpoint of chip area to use a low breakdown voltage MOSFET for a logic circuit or the like which does not require a breakdown voltage of about medium breakdown voltage. Accordingly, in the low side driver circuit, a constant voltage of about the breakdown voltage for the low breakdown voltage MOSFET is generated, and this constant voltage is used as a power supply potential of the circuit to use the low breakdown voltage MOSFET.

Also, WO2015/001926 discloses a technique that enables the use of a low breakdown voltage MOSFET by forming a semiconductor region in which a VL potential which is lower than a VB potential is a power supply potential in a high-side circuit, so as to have a unique isolation structure within the high side.

In a conventional self-separation type HVIC, a high potential separation occurs between an n-type semiconductor region generally provided on the surface layer of a p-type substrate, and the n-type semiconductor region is connected to the power supply potential of a high-potential side circuit. Therefore, in the HVIC having such a separation structure, the power supply potential of the circuit cannot be lowered, and even if a circuit that can be configured with a low breakdown voltage MOSFET, the circuit requires a medium breakdown voltage device for its configuration, leading to a larger chip area.

SUMMARY

An object of the present invention is to reduce a chip area of the high-side driver circuit.

In the high-side driver circuit of the present invention, a first potential is set as a power supply potential. The high-side driver circuit includes a constant voltage circuit, a logic circuit, a level shift circuit, and a driver circuit. The constant voltage circuit is configured to operate with a second potential as a reference potential, and generate, from the first potential, a third potential which is lower than the first potential and higher than the second potential. The logic circuit is configured to operate with the third potential as a reference potential. The level shift circuit is configured to receive an output signal of the logic circuit and shift a reference potential of the output signal from the third potential to the second potential. In the driver circuit, the second potential shifted by the level shift circuit is set as a reference potential, and the driver circuit is configured to drive a switching element by the output signal of the logic circuit.

In the high-side driver circuit of the present invention, the third potential generated from the first potential by the constant voltage circuit is set as a reference potential of the logic circuit. Accordingly, the logic circuit can be configured with a low breakdown device without adopting a unique isolation structure. Therefore, the chip area of the high-side driver circuit can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram illustrating a high voltage level shift circuit of Embodiment 2.

DESCRIPTION OF THE PREFERRED EMBODIMENTS

A. Embodiment 1

Figure 1:
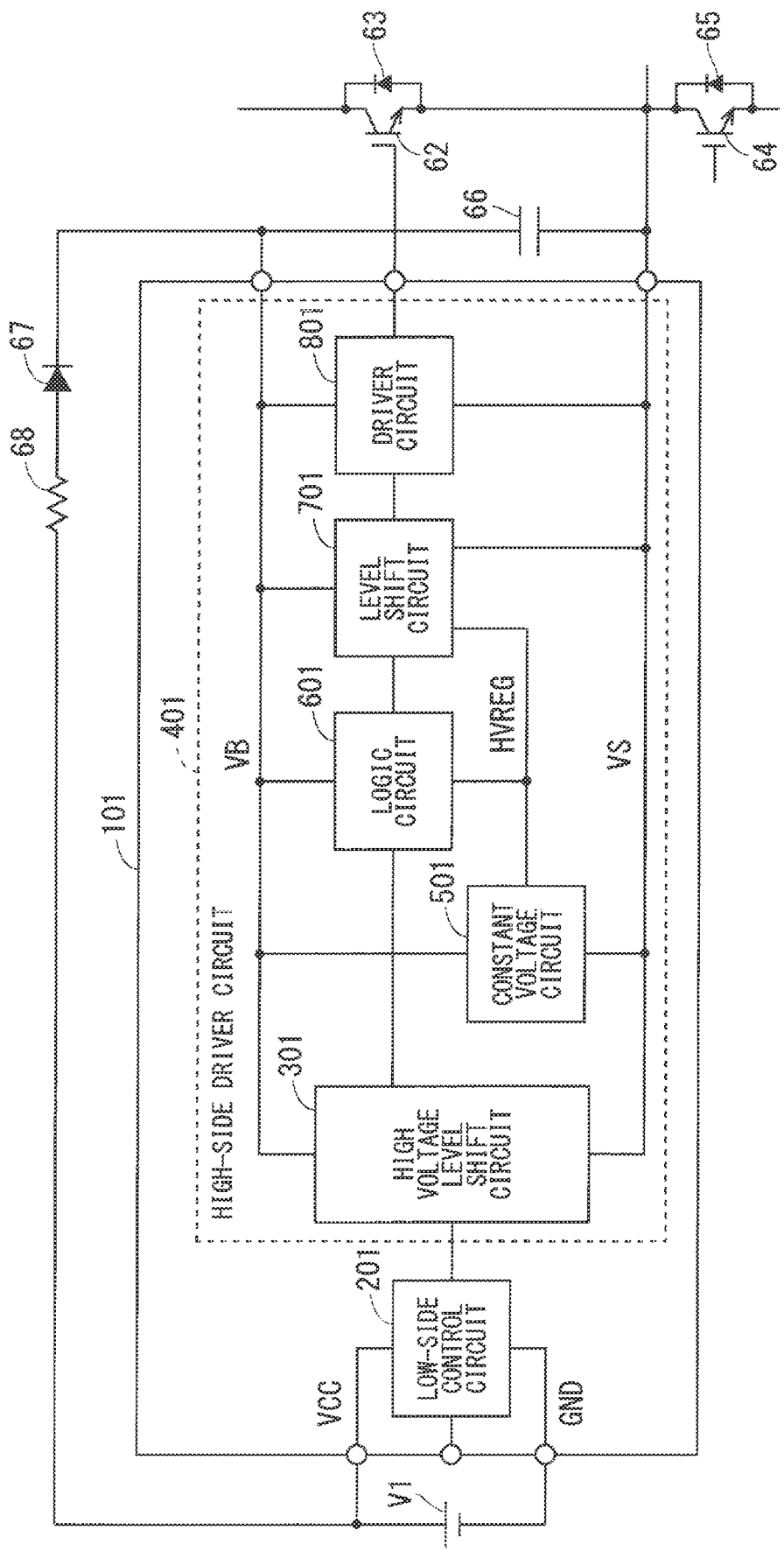
FIG. 1 is a block diagram illustrating a driver circuit of Embodiment 1.

FIG. 1 is a block diagram illustrating a driver circuit 101 of Embodiment 1. The driver circuit 101 includes a low-side control circuit 201 and a high-side driver circuit 401. The high-side driver circuit 401 includes a high voltage level shift circuit 301, a constant voltage circuit 501, a logic circuit 601, a level shift circuit 701, and a driver circuit 801. For the high voltage level shift circuit 301, the constant voltage circuit 501, the logic circuit 601, the level shift circuit 701, and the driver circuit 801, a first potential VB is set as a power supply potential. For the high voltage level shift circuit 301, the constant voltage circuit 501, and the driver circuit 801, a second potential VS is set as a reference potential. For the logic circuit 601, an HVREG generated by the constant voltage circuit 501 is set as a reference potential. Further, for the level shift circuit 701, VS is set as a first reference potential and HVREG is set as a second reference potential. In the driver circuit 101, the HVREG which is a third potential generated by the constant voltage circuit 501 is a reference potential of the logic circuit 601; therefore, the logic circuit 601 can be configured with a low breakdown voltage MOSFET.

A capacitor 66 is connected between the power supply potential VB and the reference potential VS of the high-side driver circuit 401. The capacitor 66 constitutes a bootstrap circuit together with a diode 67 and a resistor 68 connected between a power supply potential VCC of the low-side control circuit 201 and the power supply potential VB of high-side driver circuit 401, and serves as a floating power supply driving the high-side driver circuit 401. The driver circuit 801 is connected to a gate terminal of an IGBT 62 to be switched. A diode 63 is connected between a collector and an emitter of the IGBT 62. A collector of a diode 64 is connected to an emitter of the IGBT 62. A diode 65 is connected between the collector and an emitter of the IGBT 64. Also, a VS terminal of the driver circuit 101 is connected to the emitter of the IGBT 62.

A DC power supply VI is connected to the low-side control circuit 201. The power supply potential for the low-side control circuit 201 is VCC and its reference potential is GND. The high voltage level shift circuit 301 is connected to the low-side control circuit 201.

Figure 2:
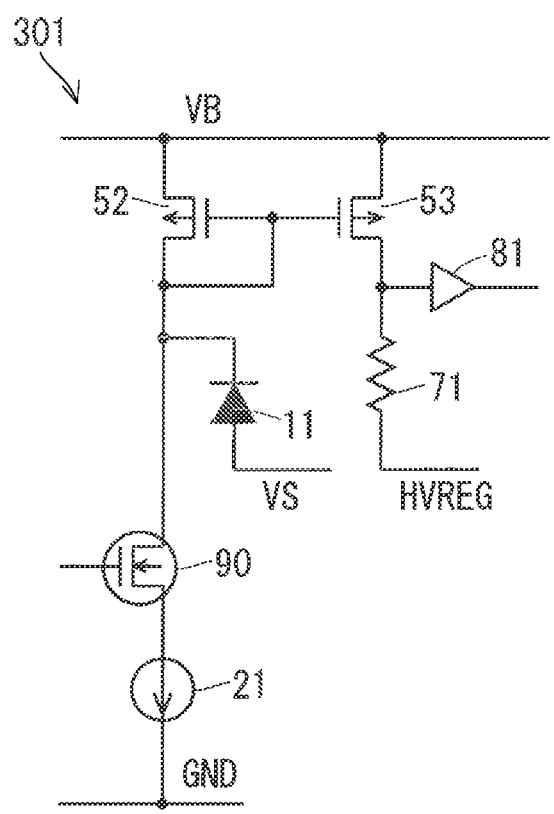
FIG. 2 is a circuit diagram illustrating a high voltage level shift circuit of Embodiment 1.

FIG. 2 illustrates a circuit configuration for the high voltage level shift circuit 301. High-voltage level shift circuit 301 includes a high-voltage n-type MOSFET 90 (hereinafter also referred to as NMOS 90), a bias circuit 21, a diode 11, p-type MOSFETs 52 and 53 (hereinafter also referred to as PMOSs 52 and 53), a resistor 71, and a buffer 81. A signal from the low-side control circuit 201 is input to a gate of the NMOS 90, and the NMOS 90 is switched by the signal. The NMOS 90 is also referred to as a first switching element. The bias circuit 21 is connected between a source of the NMOS 90 and the reference potential GND. Between a drain of the NMOS 90 and the power supply potential VB, a current mirror circuit composed of PMOSs 52 and 53 is connected. A drain of the PMOS 52 and a gate of the PMOS 53 are connected to the drain of the NMOS 90. A current-voltage conversion circuit composed of the resistor 71 and the buffer 81 is connected to a drain of the PMOS 53 which is the secondary side of the current mirror circuit.

An output signal of the low-side control circuit 201 controls the switching of the high breakdown voltage NMOS 90. When the NMOS 90 is on, the current generated by the bias circuit 21 flows between a source and the drain of the PMOS 52. As a result, a current similar to that between the source and the drain of the PMOS 52 also flows between a source and the drain of the PMOS 53 on the secondary side of the current mirror circuit. The drain current of the PMOS 52 flows to the resistor 71 and a voltage is generated at both ends of the resistor 71. This voltage is input to the logic circuit 601 through the buffer 81. As described above, in the high-voltage level shift circuit 301, a low-side signal is level-shifted to the high side by converting a current supplied via the NMOS 90 into a voltage on the high side.

A diode 11 is preferably connected between the drain of the PMOS 52 and the reference potential VS. The PMOS 52 is also referred to as a second switching element. The drain potential of the PMOS 52 is a potential dropped from the power supply potential VB by the drain-source voltage of the PMOS 52. However, when the reference potential VS and the power supply potential VB rapidly change, the drain potential of the PMOS 52 does not follow the change of the power supply potential VB, and the drain-source voltage becomes large. When the drain-source voltage exceeds the breakdown voltage of the PMOS 52, the PMOS 52 is broken. However, a diode 11 is inserted between the drain of the PMOS 52 and the reference potential VS, whereby the drain potential of the PMOS 52 is suppressed from becoming a potential lower than the reference potential VS, and the destruction of the PMOS 52 is suppressed. For the above reasons, the PMOSs 52 and 53 need to be formed of medium breakdown voltage devices.

Figure 3:
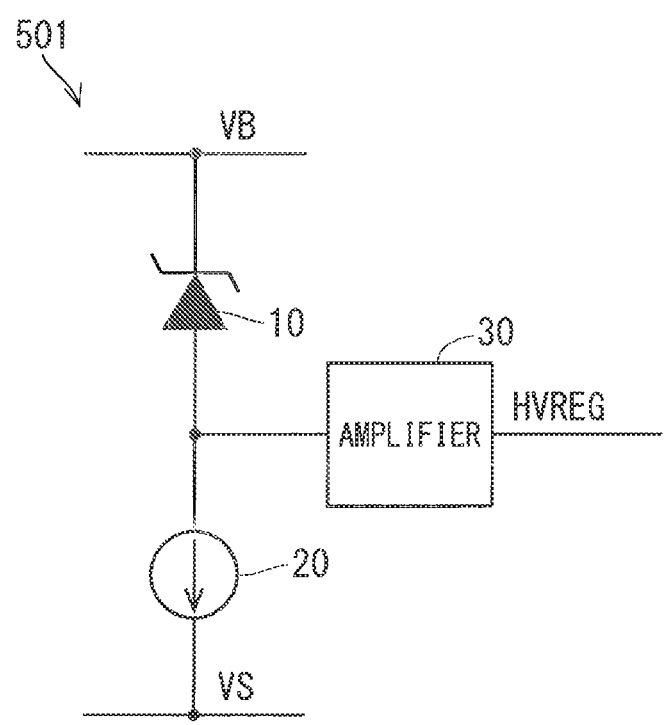
FIG. 3 is a circuit diagram illustrating a constant voltage circuit of Embodiment 1.

FIG. 3 illustrates a circuit configuration for the constant voltage circuit 501. The constant voltage circuit 501 generates HVREG with reference to the power supply potential VB. The constant voltage circuit 501 includes a Zener diode 10, a bias circuit 20, and an amplifier 30. The cathode of the Zener diode 10 is connected to the power supply potential VB, and the bias circuit 20 is connected between the anode of the Zener diode 10 and the reference potential VS. A stable current supplied from the bias circuit 20 stabilizes the operation of the Zener diode 10. As shown in FIG. 3, the voltage generated by the Zener diode 10 desirably is amplified by the amplifier 30. Thereby, the variation of HVREG due to the load of the logic circuit 601 or the like is suppressed.

Figure 4:
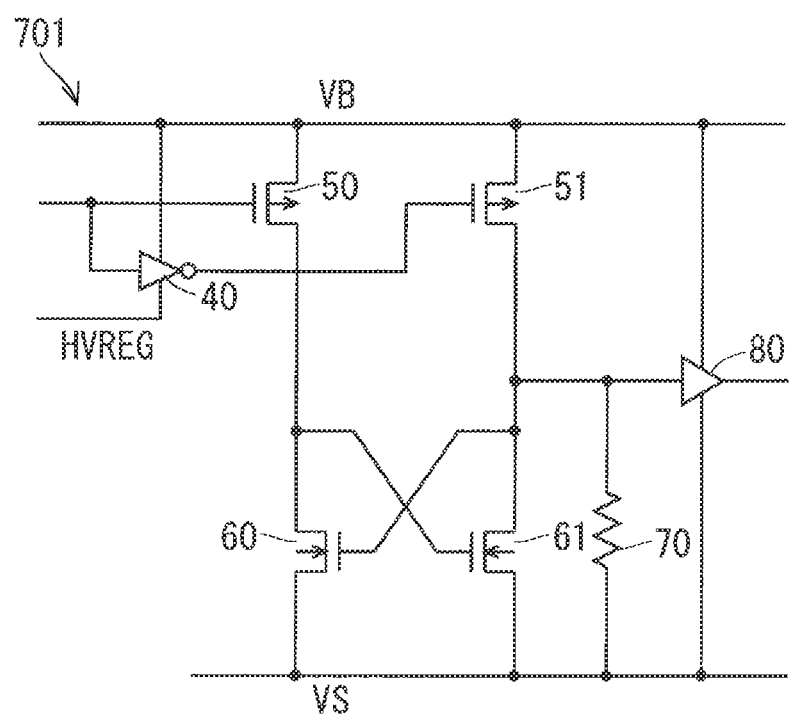
FIG. 4 is a circuit diagram illustrating a level shift circuit of Embodiment 1.

FIG. 4 illustrates a circuit configuration for the level shift circuit 701. The level shift circuit 701 includes an inverter 40, PMOSs 50 and 51, NMOSs 60 and 61, a resistor 70 and a buffer 80. The PMOS 50 and the NMOS 60 are connected in a totem pole manner, and the PMOS 51 and the NMOS 61 are connected in a totem pole manner. Sources of the PMOSs 50 and 51 are connected to the power supply potential VB. Sources of the NMOSs 60 and 61 are connected to the reference potential VS. Drains of the NMOSs 60 and 61 are connected to the drains of the PMOSs 50 and 51, respectively. Gates of the NMOSs 60 and 61 are connected to each other's drains. The resistor 70 is connected between the drain of the NMOS 61 and the reference potential VS. Also, the drain of the NMOS 60 is connected to an input terminal of the buffer 80. For the buffer 80, VB is set as a power supply potential and VS is set as a reference potential. The output of the buffer 80 is the output of the level shift circuit 701 and is input to the driver circuit 801.

A signal, the reference potential of which is HVREG is input to the gates of the PMOSs 50 and 51. A signal obtained by inverting the signal input to the PMOS 50 through the inverter 40 is input to the PMOS 51.

For example, when a high signal is input in the PMOS 50, a low signal is input to the PMOS 51. At this time, although the potential of the low signal is HVREG, it is sufficiently lower than the potential at which the PMOS 51 turns to an on state, and the PMOS 51 turns to the on state. Further, the high signal is input to the PMOS 50, the PMOS 50 turns to an off state. With the PMOS 50 being the off state and the PMOS 51 being the on state, the NMOS 60 is in the on state and the NMOS 61 is in the off state. The PMOS 51 is in the on state and the NMOS 61 is in the off state; therefore, the output potential of the buffer 80 is high. At this time, the high potential output from the buffer 80 is the VB potential.

Further, when the low signal is input in the PMOS 50, the high signal is input to the PMOS 51. At this time, the PMOS 50 turns to the on state and the PMOS 51 turns to the off state. Accordingly, the NMOS 60 turns to the off state and the NMOS 61 turns to the on state. The PMOS 51 is in the off state and the NMOS 61 is in the on state; therefore, the output potential of the buffer 80 is low. At this time, the low potential output from the buffer 80 is the VS potential. According to the above operation, in the level shift circuit 701, the reference potential of the signal is level-shifted from HVREG to VS.

As described above, the high-side driver circuit 401 of Embodiment 1 is a high-side driver circuit in which the first potential VB is set as the power supply potential, includes the constant voltage circuit 501 that operates with the second potential VS as the reference potential, and generates, from VB, HVREG which is the third potential which is lower than VB and higher than VS, the logic circuit 601 that operates with the HVREG as the reference potential, the level shift circuit 701 that receives the output signal of the logic circuit 601 and shifts the reference potential of the output signal from HVREG to VS, and the driver circuit 801 in which the second potential VS shifted by the level shift circuit 701 is set as a reference potential, and drives the IGBT 62 which is a switching element, by the output signal of the logic circuit 601. Accordingly, the logic circuit 601 operates with HVREG as the reference potential and VB as the power supply potential; therefore, configuration with the low breakdown voltage device can be ensured. Therefore, the chip area of the high-side driver circuit 401 can be reduced.

The constant voltage circuit 501 of the high-side driver circuit 401 includes the Zener diode 10, a cathode of which is connected to VB and the bias circuit 20 connected to the anode of the Zener diode 10 and supplies a current to the Zener diode 10. By supplying a stable current to the Zener diode 10 by the bias circuit 20, the potential HVREG generated by the constant voltage circuit 501 is stabilized.

The high-side drive circuit 401 of Embodiment 1 includes a high voltage level shift circuit 301 that shifts the level of an input signal from the low side to the high side and inputs it to the logic circuit. The high voltage level shift circuit 301 includes the NMOS 90 which is a first switching element, a gate of which receives an input signal, the PMOS 52 which is a second switching element, a drain of which is connected to the drain of the NMOS 90 and a source of which is connected to VB, and a diode 11, a cathode of which is connected to the drain of the PMOS 52 and an anode of which is connected to VS. Therefore, the drain potential of the PMOS 52 is suppressed from becoming a potential lower than the reference potential VS, and the destruction of the PMOS 52 is suppressed.

B. Embodiment 2

A driver circuit of Embodiment 2 is obtained by replacing the high voltage level shift circuit 301 with a high voltage level shift circuit 302 in the driver circuit 101 shown in FIG. 1. FIG. 5 is a circuit diagram illustrating the high voltage level shift circuit of Embodiment 2. The high voltage level shift circuit 302 includes a Zener diode 12 instead of the diode 11 in the configuration of the high voltage level shift circuit 301 of Embodiment 1 shown in FIG. 2. The cathode of the Zener diode 12 is connected to the drain of the PMOS 52, and the anode is connected to the power supply potential VB. With such a configuration, it is possible to clamp the drain potential of the PMOS 52 when the power supply potential VB variates to a potential lower than the power supply potential VB by the breakdown voltage of the Zener diode 12. As a result, the PMOSs 52 and 53 can be configured with low breakdown voltage elements, and the chip area of the high voltage level shift circuit 302 can be reduced.

The high-side drive circuit of Embodiment 2 includes the high voltage level shift circuit 302 that shifts the level of an input signal from the low side to the high side and inputs it to the logic circuit. The high voltage level shift circuit 302 includes the NMOS 90 which is a first switching element, a gate of which receives an input signal, the PMOS 52 which is a second switching element, a drain of which is connected to the drain of the NMOS 90 and a source of which is connected to VB, and the Zener diode 12, an anode of which is connected to the drain of the PMOS 52 and a cathode of which is connected to VB. With such a configuration, it is possible to clamp the drain potential of the PMOS 52 when the power supply potential VB variates to a potential lower than the power supply potential VB by the breakdown voltage of the Zener diode 12. As a result, the PMOSs 52 and 53 can be configured with low breakdown voltage elements, and the chip area of the high voltage level shift circuit 302 can be reduced.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A high-side driver circuit in which a first potential is set as a power supply potential, comprising:
   a constant voltage circuit configured to operate with a second potential as a reference for the constant voltage circuit, and generate, from the first potential, a third potential which is lower than the first potential and higher than the second potential;
   a logic circuit configured to operate with the third potential as a reference for the logic circuit;
   a level shift circuit configured to receive an output signal of the logic circuit and shift the reference of the output signal from the third potential to the second potential;
   a driver circuit in which the second potential shifted by the level shift circuit is set as a reference of the driver circuit, and configured to drive a switching element by the output signal of the logic circuit; and
   a high voltage level shift circuit configured to shift a level of an input signal from the second potential to the third potential and input the input signal to the logic circuit.

2. The high-side driver circuit according to claim 1, wherein
   the logic circuit is configured with a low breakdown voltage device.

3. The high-side driver circuit according to claim 1, wherein
   the constant voltage circuit includes
      a Zener diode, a cathode of which is connected to the first potential, and
      a bias circuit connected to an anode of the Zener diode and configured to supply a current to the Zener diode.

4. A high-side driver circuit in which a first potential is set as a power supply potential, comprising:
   a constant voltage circuit configured to operate with a second potential as a reference for the constant voltage circuit, and generate, from the first potential, a third potential which is lower than the first potential and higher than the second potential;
   a logic circuit configured to operate with the third potential as a reference for the logic circuit;
   a level shift circuit configured to receive an output signal of the logic circuit and shift the reference of the output signal from the third potential to the second potential;
   a driver circuit in which the second potential shifted by the level shift circuit is set as a reference of the driver circuit, and configured to drive a switching element by the output signal of the logic circuit; and
   a high voltage level shift circuit configured to shift a level of an input signal from a low side to a high side and input the input signal to the logic circuit, wherein
   the high voltage level shift circuit includes
      a first switching element, a gate of which receives the input signal,
      a second switching element, a drain of which is connected to a drain of the first switching element and a source of which is connected to the first potential, and
      a diode, a cathode of which is connected to a drain of the second switching element and an anode of which is connected to the second potential.

5. A high-side driver circuit in which a first potential is set as a power supply potential, comprising:
   a constant voltage circuit configured to operate with a second potential as a reference for the constant voltage circuit, and generate, from the first potential, a third potential which is lower than the first potential and higher than the second potential;

a logic circuit configured to operate with the third potential as a reference for the logic circuit;

a level shift circuit configured to receive an output signal of the logic circuit and shift the reference of the output signal from the third potential to the second potential;

a driver circuit in which the second potential shifted by the level shift circuit is set as a reference of the driver circuit, and configured to drive a switching element by the output signal of the logic circuit; and a high voltage level shift circuit configured to shift a level of an input signal from a low side to a high side and input the input signal to the logic circuit, wherein the high voltage level shift circuit includes
- a first switching element, a gate of which receives the input signal,
- a second switching element, a drain of which is connected to a drain of the first switching element and a source of which is connected to the first potential, and
- a Zener diode, an anode of which is connected to a drain of the second switching element and a cathode of which is connected to the second potential.

6. The high-side driver circuit according to claim 5, wherein the second switching element includes a low breakdown voltage device.

* * * * *